US006614236B1

(12) United States Patent
Karam

(10) Patent No.: US 6,614,236 B1
(45) Date of Patent: *Sep. 2, 2003

(54) CABLE LINK INTEGRITY DETECTOR

(75) Inventor: Roger A. Karam, Sunnyvale, CA (US)

(73) Assignee: Cisco Technology, Inc., San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/270,965

(22) Filed: Mar. 17, 1999

(51) Int. Cl.[7] ............................................. G01R 31/08
(52) U.S. Cl. ..................................................... 324/532
(58) Field of Search ................................ 324/532, 533, 324/539, 646, 647, 527, 528, 534, 617, 621, 535; 455/67.4, 67.5, 67.6

(56) References Cited

U.S. PATENT DOCUMENTS

| 4,644,348 A | | 2/1987 | Gerety | 340/825.06 |
|---|---|---|---|---|
| 4,715,064 A | | 12/1987 | Claessen | 379/392 |
| 4,875,223 A | | 10/1989 | Curtis | 375/258 |
| 5,142,526 A | * | 8/1992 | Moriue et al. | 370/14 |
| 5,223,806 A | | 6/1993 | Curtis et al. | 333/12 |
| 5,289,390 A | * | 2/1994 | Unverrich | 364/562 |
| 5,321,372 A | | 6/1994 | Smith | 333/1 |
| 5,461,318 A | * | 10/1995 | Borchert et al. | 324/533 |
| 5,530,367 A | * | 6/1996 | Bottman | 324/616 |
| 5,574,726 A | | 11/1996 | Chan et al. | 370/85.3 |
| 6,140,911 A | | 10/2000 | Fisher et al. | 340/310.01 |
| 6,289,198 B1 | * | 9/2001 | Kawamura et al. | 399/333 |

OTHER PUBLICATIONS

"Gigabit Interface Converters (GBIC) for Fibre Channel", Product Information [online] retrieved on Feb. 17, 1999, retrieved from the Internet:<URL:http://www.hp.com/HP–COMP/gigabit/tcgbic.html>, 3 pages.

* cited by examiner

Primary Examiner—Safet Metjahic
Assistant Examiner—Etienne P LeRoux
(74) Attorney, Agent, or Firm—Ritter, Lang & Kaplan LLP

(57) ABSTRACT

A method and apparatus for measuring the length of a cable link in a computer network sends a test signal through the cable and examines how the signal is received. Measurements of the signal transit time, decrease in signal amplitude, and decrease in signal power are three techniques that may be used to measure cable lengths, individually or in combination. One or more transceivers are connected to the cable to send and receive the test signals, so that there is no need for access to the cable, except at the ends. Cable lengths may be calculated for both electrically conductive and fiber optic type cables. The length of an existing cable may be compared with a maximum length allowed by a particular data transfer protocol to verify compliance, or it may be compared against a previously stored value for purposes such as security checks to verify that the cable properties have not been altered as they might be if the cable were tapped, rerouted or extended.

12 Claims, 7 Drawing Sheets

CABLE LINK INTEGRITY DETECTOR

BACKGROUND OF THE INVENTION

1. Field of the Invention

The present invention relates to cable integrity in a network. More particularly, the present invention relates to determining the length of cables linking points in a network and maintaining the integrity and security of those links.

2. The Background

Computer networks using cables to link devices such as computers are common and the number of such networks is growing. Ethernet, as specified by Institute of Electrical and Electronics Engineers (IEEE) Standard 802.3 (1985), and Token Ring, IEEE Standard 802.5 (1985), are just two of the many standards for such networks known in the art. In addition to these standards, there are also many proprietary or non-standard network configurations. In most cases, there are well-defined specifications for the cables and the arrangement of the devices in such networks. There are also many various types of cables known in the art, such as coaxial, shielded twisted pairs, unshielded twisted pairs and fiber optic. Each of these cable types can typically be further subdivided, such as the Electronic Industry Association (EIA/Telecommunications Industry Association (TIA) Category system for unshielded twisted pair cables. There may be an overlap between network configurations and cable specifications, a given cable may support more than one configuration, and vice versa.

The trend in computer networks is clearly towards faster rates of data transfer. This trend exists both in response to the needs of users and because of a push by the industry to make available the technology that is possible, ideally ahead of the competition. Coexisting with this trend towards faster networks is an existing infrastructure of installed hardware, such as cables routed through and between buildings. It would be advantageous to use this existing infrastructure where possible, thereby minimizing the total costs to upgrade the capabilities of a network.

Existing network cables were often installed with a particular type of network and cable specification in mind. For example, many existing cables were installed with 100–150 meters or less between devices in order to conform to Ethernet 10Base-T and/or Ethernet 100Base-T standards. These Ethernet Base-T systems typically use only two pairs of conductors while many of the cables used for this purpose contain four pairs of conductors. It is quite possible to envision that a new network protocol, not defined today, will make use of these extra pairs of conductors to increase the speed of data transmissions. It is also possible that a new protocol may use these cables, originally installed for Ethernet 10Base-T or Ethernet 100Base-T systems, but require a shorter distance between devices in order to facilitate faster data transfers. It would be advantageous to have a way of easily measuring the length of existing network cables when making a decision concerning whether or not to use the cable to support a new network protocol. Ideally, it would not require physically measuring the lengths of cables that may not be easily accessible, such as those behind walls, in ceilings and shafts, and under floors.

There are methods known in the art that locate hidden cables using tone generators. These methods still require tracing the route of an existing cable through the walls in order to physically measure the length. There are also devices such as Time Domain Reflectometers (TDRs) known in the art that measure cable lengths by sending a signal down a cable and measuring the reflection back. TDRs only use one end of a cable and rely on the weak signal reflected back from a discontinuity at the other end of the cable to estimate the length of a cable, sometimes leading to relatively poor estimates of length. Accurate TDRs exist, although they are expensive. It would be advantageous to measure the signal directly, rather than the weak reflection, in order to inexpensively measure the length of a cable. It would also be advantageous to have a cable measurement system integrated into the computer network so that software may invoke it in order to detect unauthorized taps in the cable and for other purposes.

SUMMARY OF THE INVENTION

A method and apparatus for measuring the length of a cable link in a computer network sends a test signal through the cable and examines how the signal is received. Measurements of the signal transit time, decrease in signal amplitude, and decrease in signal power are three techniques that may be used to measure cable lengths, individually or in combination. One or more transceivers are connected to the cable to send and receive the test signals, so that there is no need for access to the cable, except at the ends. Cable lengths may be calculated for both electrically conductive and fiber optic type cables. The length of an existing cable may be compared with a maximum length allowed by a particular data transfer protocol to verify compliance, or it may be compared against a previously stored value for purposes such as security checks to verify that the cable properties have not been altered as they might be if the cable were tapped, rerouted, shortened, extended or otherwise changed.

DETAILED DESCRIPTION OF THE PREFERRED EMBODIMENTS OF THE INVENTION

Figure 1:
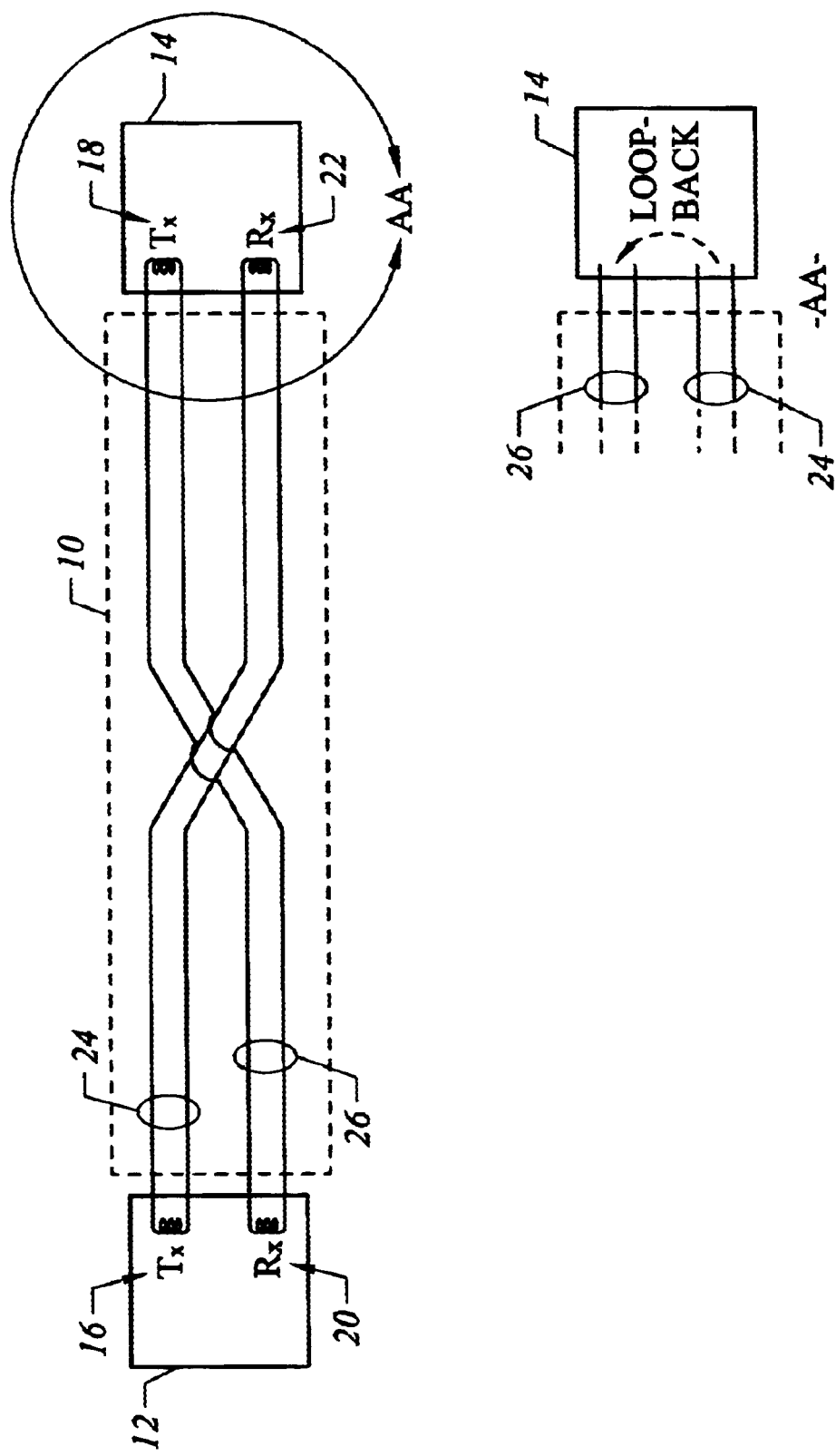
FIG. 1 is a schematic diagram of two transceivers attached to the ends of a cable.

Those of ordinary skill in the art will realize that the following description of the present invention is illustrative only and not in any way limiting. Other embodiments of the invention will readily suggest themselves to such skilled persons after an examination of the within disclosure.

The present invention provides an apparatus and method for determining the length of a cable linking devices in a network, without tracing the cable routing or physically measuring the cable. Three methods are disclosed to measure cable lengths and they may be used individually or in combination. Each method uses one or more transceivers attached to a cable to send a signal through the cable and calculate the cable length based on the received signal. Measuring the time it takes a signal to travel the length of a cable, the attenuation in signal amplitude, and the attenuation in signal power are techniques that allow measurement of a network cable without the need for access to the cable along its entire length.

The requirements for the transceivers vary with the method used to measure the cable length. In one embodiment a "loopback" mechanism, such as, but not limited to, a conductor between two terminals, may be used as a transceiver returning a signal back through a cable to the sending transceiver. In other embodiments the two transceivers may more actively cooperate. The transceiver receiving the signal may actively produce a response signal or it may pass the same signal back to the sending transceiver using a mechanism such as, but not limited to, a band pass filter. The transceivers may be components within computing devices connected to the network, allowing software to invoke the measurement process. This use of software to invoke the cable measurement facilitates use of the present invention in a system where the cables connecting the devices may be monitored as a verification measure to insure signal integrity, such as compliance with a relevant data transfer protocol, or as a security measure so that any changes in cable properties, such as may occur with an unauthorized tap or reconfiguration of the cable, may be detected.

There are many methods known in the art to connect computing devices in a network with various types of cables. The present invention may be used with, but is not intended to be limited to, either fiber optic or electrically conductive cables such as coaxial, shielded and unshielded twisted pair cables. Similarly, the present invention is not intended to be limited to any particular data transfer protocol, provided of course that the data transfer protocol uses a cable as a physical link between the devices.

There is a clear trend in computer networks towards faster rates of data transfer. As new data transfer protocols are developed to upgrade existing systems, the length of the network cables becomes increasingly important. As a rule of thumb, faster data transfer rates require more stringent specifications on a given cable linking devices in a network. For example, an existing cable may handle data at 10 MHz without problems but fail to adequately perform at 100 MHz, solely because the cable run between the devices is too long. The problem of excessive cable length is compounded when upgrading a system if the existing cable is not easily accessible, such as when the cable is routed inside a wall. Data transfers over excessive length cables may lead to undesirably high bit error rates (BER). One embodiment of the present invention uses cable length measurement for upgrading an existing network system to a faster data transfer protocol with the existing cables. The existing cable length is measured with the present invention to determine if the cable is within a specified maximum length allowed by the proposed new protocol.

Referring now to FIG. 1, a schematic representation of a cable 10 linking transceivers 12 and 14 is shown. Transceivers 12 and 14 may be contained within other devices connected to cable 10, such as computers that make up a local area network (LAN), or they may be stand-alone devices. Each transceiver may contain one or more separate transmit ports 16 and 18 and receive ports 20 and 22.

Cable 10 may contain a number of individual conductors some of which may not be used by a particular data transfer protocol. The embodiment shown in FIG. 1 uses two pairs of conductors 24 and 26, such as are found in an Ethernet 10Base-T system. In a typical Ethernet 10Base-T system, a cable such as cable 10 in FIG.1 would contain four pairs of conductors, with two of the pairs unused. The unused pairs may either be tested or ignored by the present invention. Those of ordinary skill in the art will recognize that testing all the conductors in a cable, both used and unused, may allow a more accurate measurement of the cable length through averaging. Data transfer protocols other than Ethernet 10Base-T may utilize different numbers of conductors and cable configurations than those shown in FIG. 1 and the present invention is not intended to be limited to any particular number of conductors or cable configuration.

Figure 2:
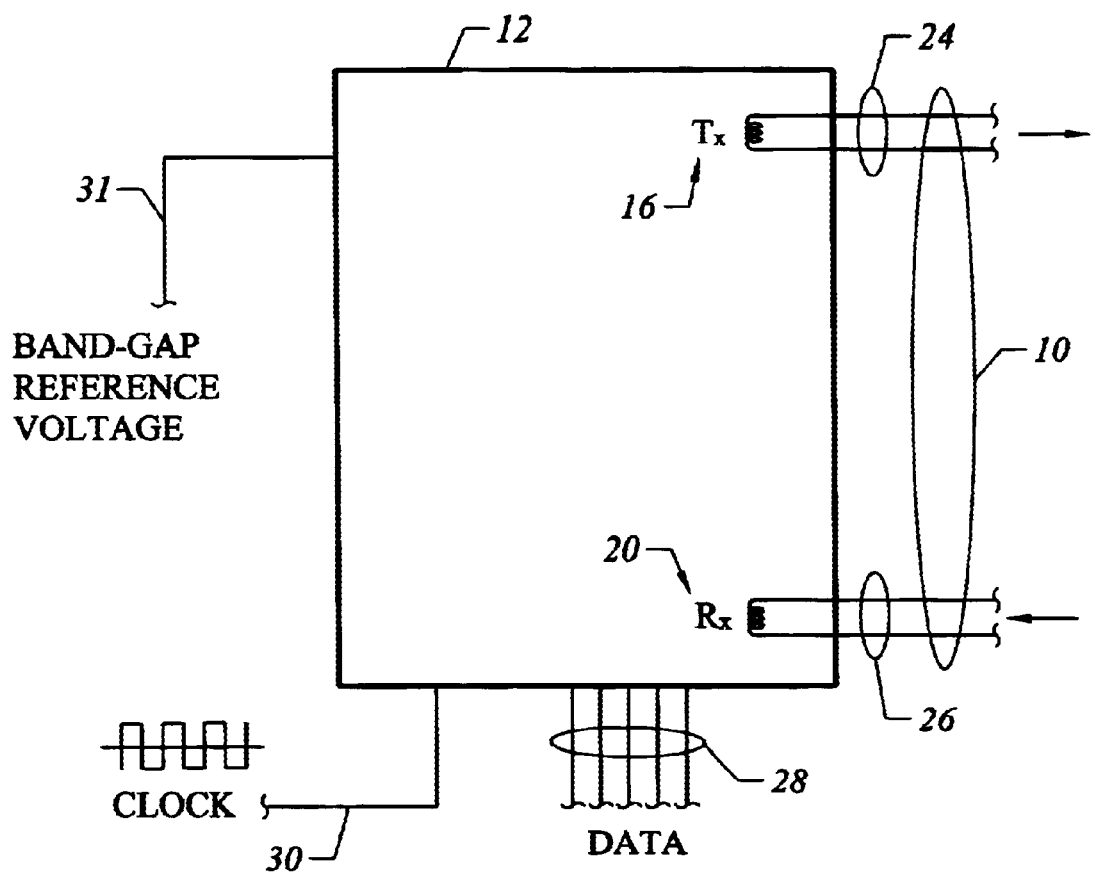
FIG. 2 is a block diagram of a transceiver.
Figure 3:
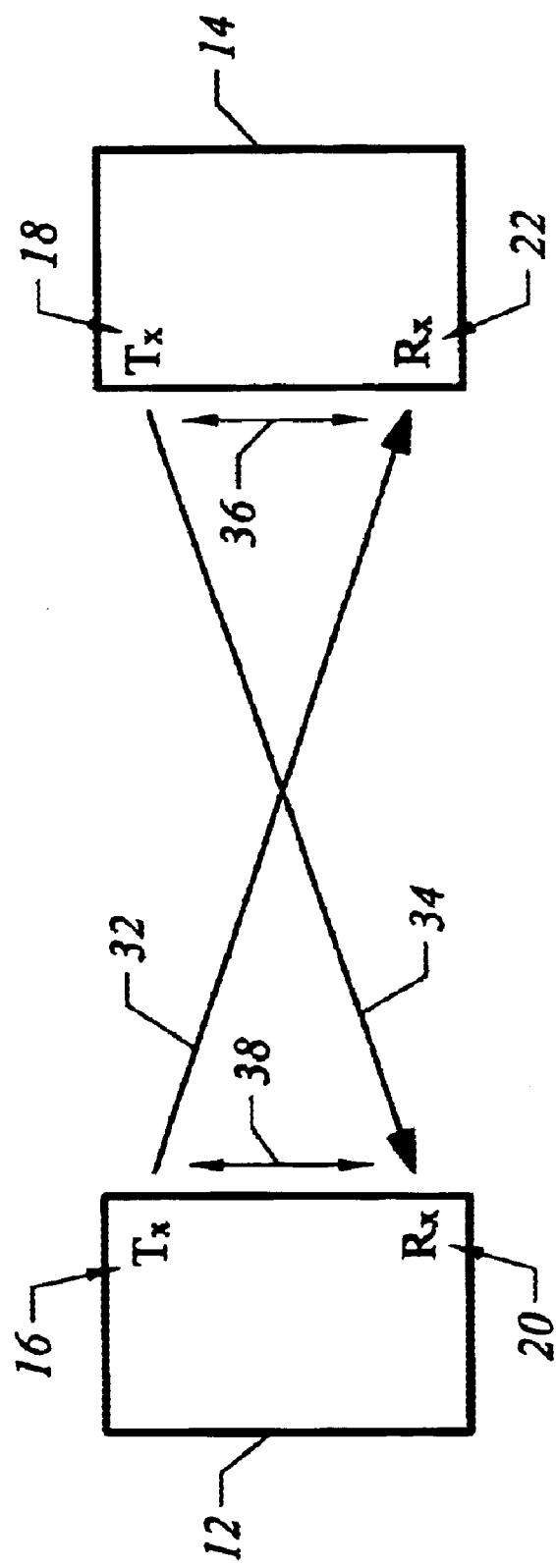
FIG. 3 is a schematic diagram of the delay components of a presently preferred embodiment of the present invention.

The following will describe how the present invention may be used to check cable lengths, by measuring delay in a 10Base-T network when a cable is first connected to a device, using FIGS. 1–3. Later, how the present invention may be used while varying these conditions will be discussed. FIG. 2 is a more detailed representation of transceiver 12, shown in FIG. 1. FIG. 3 is a schematic representation of the delays from the system shown in FIG. 1.

The delay measurement process begins when transceiver 14 is first connected to an existing network containing transceiver 12 by cable 10. The addition of transceiver 14 to the network is detected and data is exchanged between the transceivers via a method such as Fast Link Pulses (FLP) or any other method that is commonly known in the art such as sending one or more recognizable pulses. Upon recognizing the new connection of transceiver 14, transceiver 12 may send a signal to transceiver 14 indicating that a delay measurement is about to begin. This signal is sent from the transmit port 16 of transceiver 12 to the receive port 22 of transceiver 14 along conductor pair 24. Transceiver 14 would then send an acknowledgement signal back to transceiver 12, via conductor pair 26 when ready. This exchange of signals between the transceivers confirms that both are free to begin the delay measurement process. The actual delay measurement begins when transceiver 12 sends a delay test signal to transceiver 14, and simultaneously begins measuring the time until the delay test signal completes a round trip. When the delay test signal arrives at receive port 22, it is relayed to transmit port 18 (because it is recognized as a delay test signal and not as regular data) and sent back to transceiver 12 via conductor pair 26. Upon arrival of the signal at receive port 20, on transceiver 12, the round trip time of the delay test signal is known, preferably by counting the number of elapsed clock cycles. The present invention is not intended to be limited to any particular type of transceiver, for example in one embodiment cable 24 may be connected to transceiver devices that both send and receive on the same port.

The format of the delay test signal sent by transceiver 12 is not particularly important, so long as transceiver recognizes it as such. Preferably, the test signal will be similar in frequency and amplitude to the data typically expected to be transferred over the cable but distinguishable by the transceiver 14. The delay test signal may be generated by transceiver 12, stored on the transceiver in random access memory (RAM), or supplied through data channels 28. Similarly, the clock signal may be supplied by clock data path 30 or it may be generated by the transceiver 12.

Transceivers 12 and 14 may or may not be identical, although they need to cooperate in exchanging signals that begin the delay measurement process. The present invention is not intended to be limited to any particular method of cooperation between transceivers. The present invention uses the term "transceiver" very loosely, and intends to include embodiments in which one transceiver may be is a device such as, but not limited to, a loopback mechanism or bandpass filter. Preferably transceiver 14 responds to transceiver 12 with an acknowledgement and transceiver 12 transmits the delay test signal. The acknowledgement process is a method of ensuring that transceiver 14 is prepared for the measurement process and is ready to recognize and transmit the delay test signal back to transceiver 12, either quickly or after a fixed period of time. The acknowledgement and delay test signals may or may not be similar. One or both transceivers may be capable of initiating this delay measurement process.

Referring now to FIG. 3, the delays or transit times for each leg of the signal round trip are shown. The time the signal spends travelling through the cable in each direction is represented by reference numbers 32 and 34. The delay transferring the signal from receive port 22 to transmit port 18 is represented by reference 36 and the delay within transceiver 12 by 38. The sum of times 32, 34, 36 and 38 equals the total round trip time of the delay test signal as measured by transceiver 12. Times 36 and 38 are typically independent of the length of the cable and may be measured or calibrated for each transceiver prior to conducting the delay measurement. These times may then be subtracted from the total round trip time of the delay test signal prior to calculating the cable length. Those of skill in the art will recognize that the delays shown in FIG. 3 are actually aggregate delays, for example delay 36 includes the transit time of a signal between and through many individual components of transceiver 14. The present invention is not intended to be limited to any particular transceiver design.

Empirical data may be compiled for the round trip times of delay signals in a number of various cable lengths for a given type of cable. For example, delay data may be compiled for various lengths of coaxial cable using a given delay test signal, although the present invention is not intended to be limited to any particular type of cable or delay test signal. This empirical data may then be used as a basis for calculating the length of a particular cable of unknown length, given the type of cable and the measured round trip time of the delay signal. The present invention is not, however, intended to be limited to any particular method of converting the delay time to a cable length.

Given the length of the measured cable, or its proxy the measured round trip time, it can be compared to by any conventional comparator as known in art to a maximum length allowed or stored for later use. In one embodiment of the present invention creates a visual indication, such as a "green light", that appears on the screen of a newly connected device when the length of the cable is less than a specified maximum allowed length. A red or yellow light appears to indicate a cable length greater than allowed or marginally acceptable, respectively. In the claims, a device responsive to a difference between a reference elapsed time measurement and a subsequent elapsed time measurement in accordance with the foregoing is referred to as an "amplitude change detector."

The accuracy of the cable length measurement depends in part on the amount of delay in the transceivers, the variation in the delay, and the speed of the clock used to time the round trip of the delay signal. Transceivers that are fast, relative to transit time of the delay signals, and/or consistent are preferable, as are high speed clocks. That is, it is delays 32 and 34 shown on FIG. 3 that vary with cable length, not delays 36 and 38. Accuracy in measuring delays 32 and 34 is limited to the resolution of the clock signal used to time the delay signal, the delays can not easily be measured any closer than the time between consecutive edges of the clock signal. Even with a high speed clock signal, variation in delays 36 and 38 would limit what is achievable in measurement accuracy. Transceivers that process the delay signals with little or no variation in timing, regardless of the magnitude of delays 36 and/or 38, are preferable. Alternatively, transceivers that operate at high speeds, so that any variation in delays 36 and 38 is small relative to the magnitudes of delays 32 and 34, would yield more accurate cable length measurements.

The above disclosure describes a cable measurement process that is invoked when the new device is first connected to the network, the process may also be invoked at other times. The complication at times other than start-up is that the two transceivers must complete a "handshake," consisting of a request and an acknowledgement, that the transceivers can be distinguish from other data. Without this handshake a transceiver may not be available to transmit or return the delay test signal quickly, decreasing the accuracy of the measurement. The present invention may issue a system level command to both transceivers directing them to perform a cable measurement, followed by an acknowledgement from both. Alternatively, the command to perform a cable measurement after start-up may originate from one of the transceivers, instead of the system level, with an acknowledgement from the other transceiver.

Measuring attenuation of the amplitude of a signal as it travels through a cable is another method of determining the cable length used by the present invention. The process may be invoked in a manner similar to that described for measuring delay, either when a new device is connected or at any other time. This "amplitude method" of measurement sends an amplitude test signal along the cable from one transceiver to another and uses the decrease in signal amplitude (i.e. voltage) as a measure of the cable length. The amplitude test signal may be a specified sequence of bits at a known modulation voltage level, a sine wave of known peak voltage level or any other such signal as is known in the art. Preferably, amplitude test signals are selected so that the amplitude can be accurately controlled by the sending transceiver and accurately measured by the receiving transceiver. Those of skill in the art will recognize that using a band-gap reference voltage, which is readily available on many integrated circuits, as a benchmark voltage for the sending and/or receiving transceiver is one of many methods available to accurately measure the signal attenuation. This band-gap reference voltage may be supplied from components within the transceiver or from an external source as shown in FIG. 2. For a particular type cable, amplitude attenuation measurements may be done on cables of known lengths. These measurements may be used later to calculate unknown cable lengths based on the amplitude attenuation for that type of cable. Differences in voltages may be used directly to calculate cable lengths or preferably converted to the commonly used decibel scale (where $dB=20 \log v_2/v_1$), for a more linear relationship, as is known to those of skill in the art. In one embodiment of the present invention an analog to digital (A/D) converter may be used to flag amplitude test signals that attenuate beyond a specified amount, such as but not limited to when the measured voltage, as registered by the A/D converter, differs from a specified reference voltage by more than a specified number of least significant bits. In the claims, a device for measuring amplitude attenuation in accordance with the foregoing is referred to as an "amplitude attenuation detector."

Referring to FIGS. 1 and 2, the amplitude test signal could be sent from transceiver 12 to transceiver 14 along conductor(s) 24 or in the other direction along conductors 26. The measurement need not be made in both directions or on each conductor within cable 10, although averaging the measurements of multiple conductors may be done to increase accuracy. Performing this amplitude measurement in both directions is one method of providing the cable measurement information to both transceivers, although this same result may also be achieved by transferring data representing the actual attenuation measurement. Since the amplitude attenuation may occur in a single direction there is no requirement that the two transceivers are identical, only that they cooperate so that the amount of amplitude attenuation can be measured accurately. Unlike the delay measurement process, clock 30 is not used by this amplitude method, nor is a quick response needed from the second transceiver.

Fiber optic cables of various types are increasingly used to connect devices in a network and the present invention may easily be adapted and used to measure the lengths of these cables. In a presently preferred embodiment of the present invention, the decay in power of an optical signal is measured and used to compute the cable length. Devices such as Gigabit Interface Converters (GBIC), that convert an optical signal into an electric signal, are one type of device that may be used to measure the decay in signal power, although the present invention is not intended to be limited to any particular method of measuring the decay in signal power. The loss of optical signal power may be calibrated for various cable lengths and each type of fiber optic to obtain accurate measurements. A device implementing a power attenuation measurement in accordance with the foregoing is referred to in the claims as a "power attenuation detector."

Figure 4:
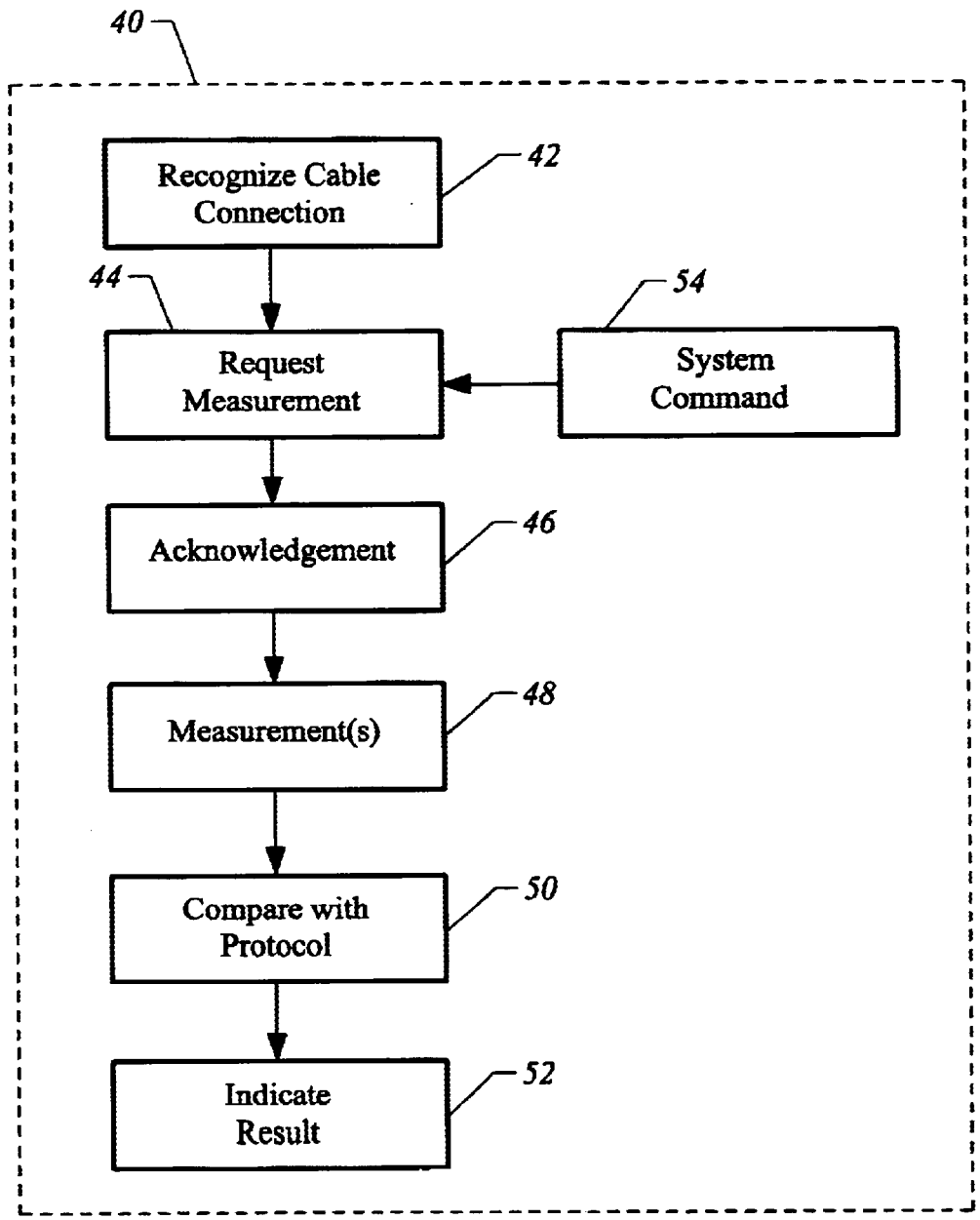
FIG. 4 is a flowchart of a method to verify that a cable is in compliance with a data transfer protocol.

Referring to FIG. 4, a method of measuring the length of a cable 40 is described in the procedures referenced as 42 through 54. The cable measurement process may be initiated by either the system recognizing a new cable connection 42 or from a system level command 54. Acknowledgement 46 of the process by the non-initiating transceiver(s) may be omitted in some embodiments of the present invention. The measurement(s) 48 process may use any of the three methods described in this disclosure, either individually or in combination. Preferably, the cable length is compared to the requirements of a specified data transfer protocol 50, although this is not required and the invention is not intended to be limited to any particular application. The indicate result 52 process may be omitted or used to invoke an indication signal, such as a visual display of the cable length on the monitors of newly connected devices, or any other indication as may be known in the art.

Figure 5:
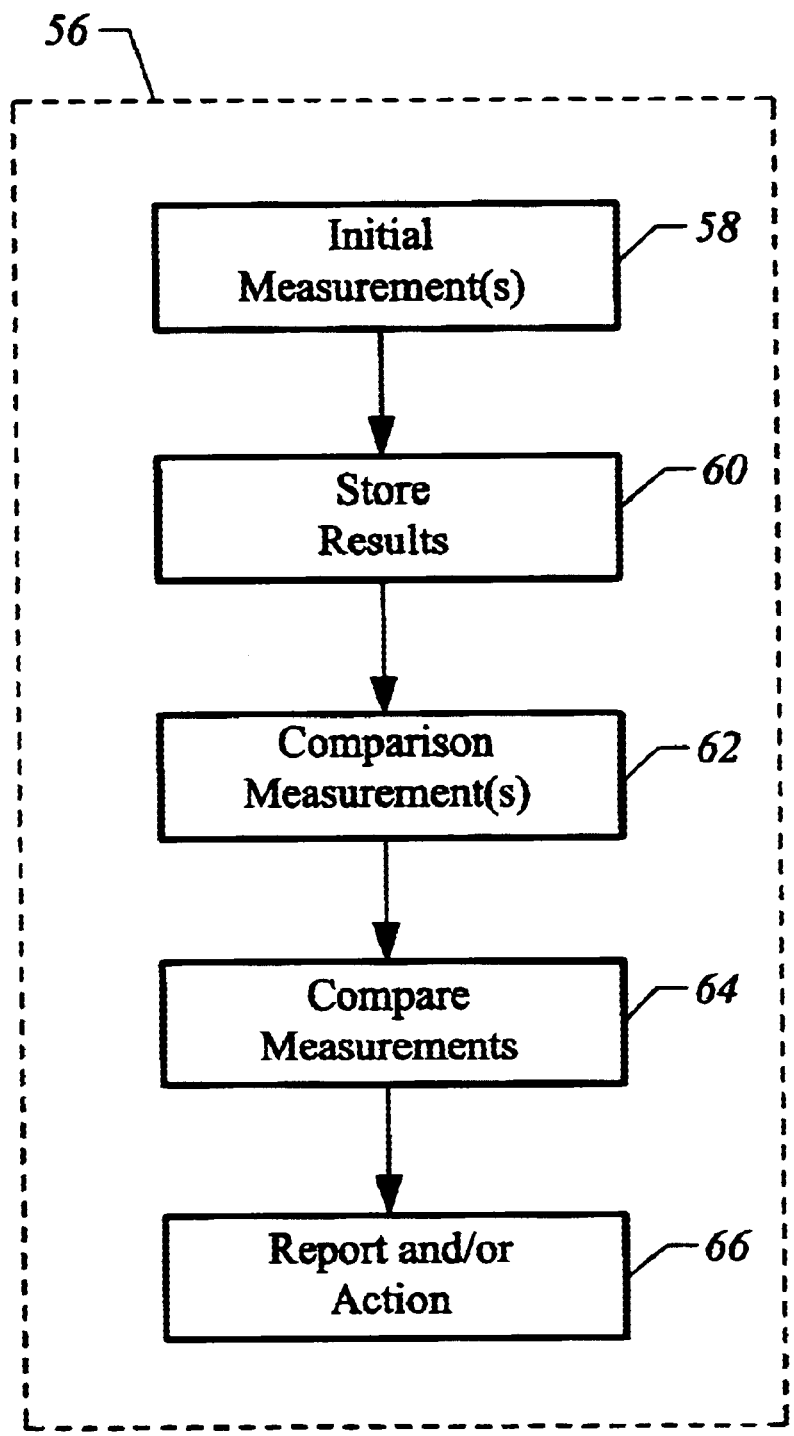
FIG. 5 is a flowchart of a method to verify that the properties of a cable have not changed.
Figure 6:
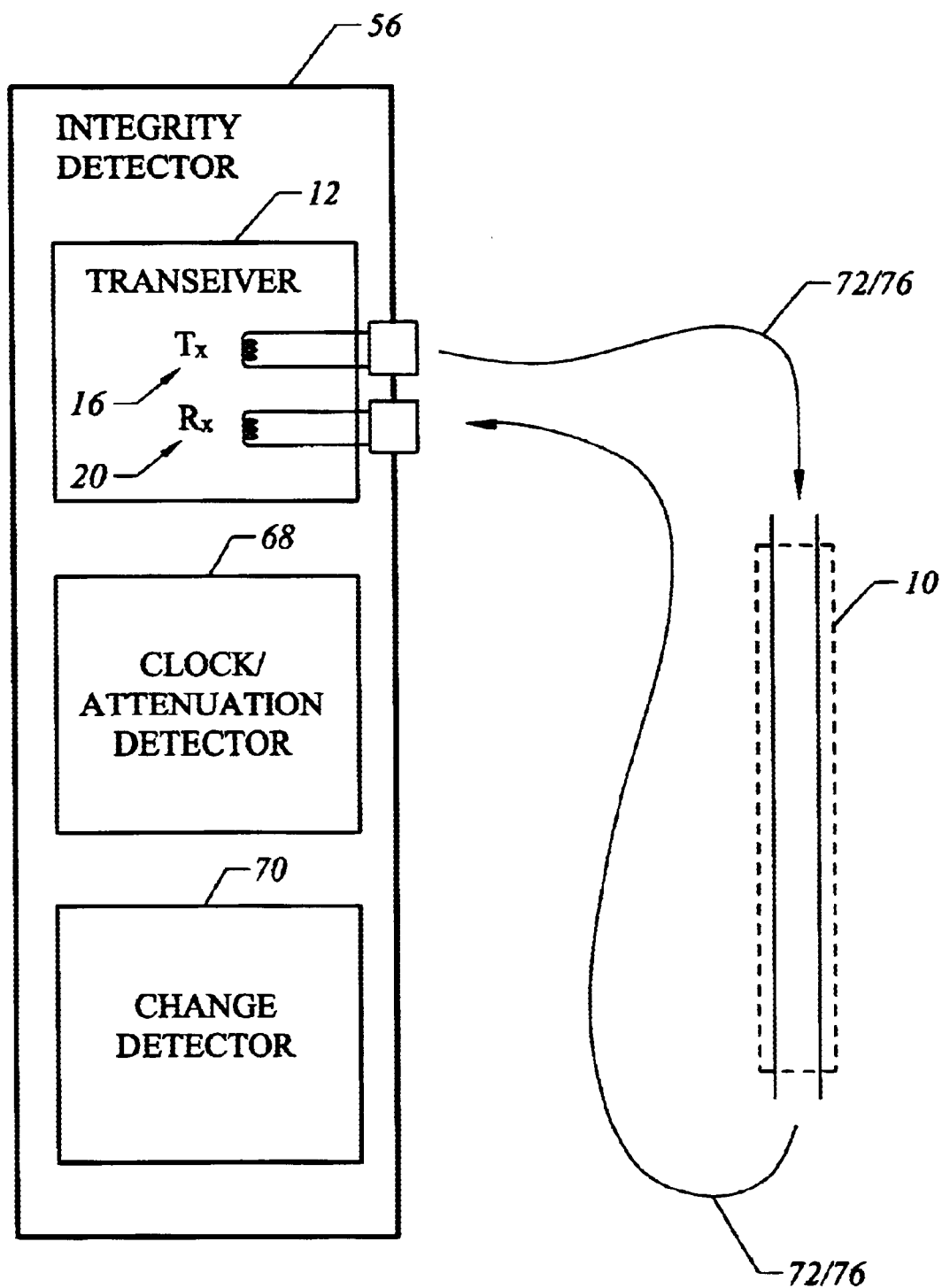
FIG. 6 is a schematic diagram of an integrity detector having one transceiver in communication with the ends of a cable.
Figure 7:
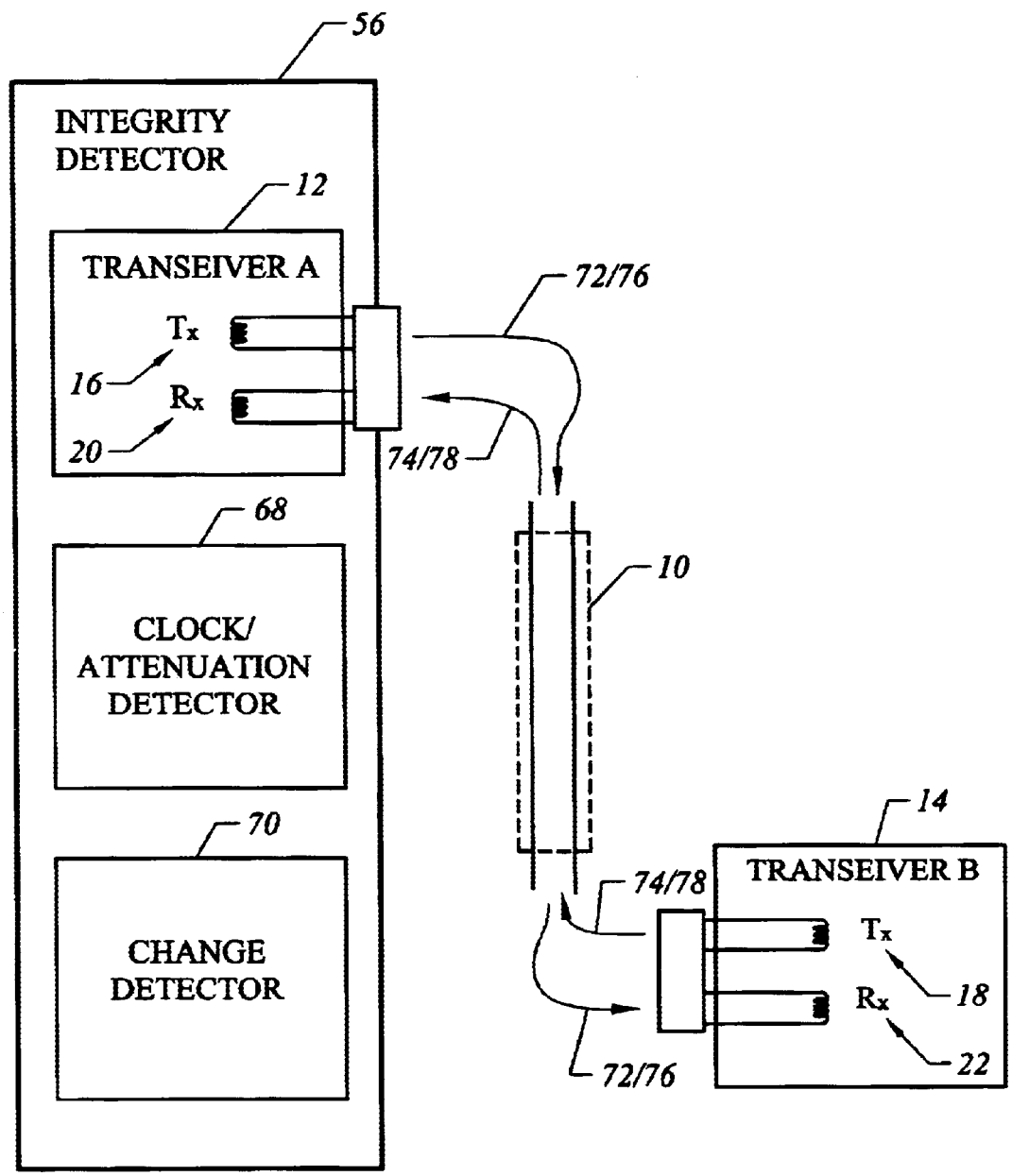
FIG. 7 is a schematic diagram of an integrity detector having two transceivers in communication with the ends of a cable.

Referring now to FIGS. 5–7, the present invention may be used as part of a network security system including a cable link integrity detector to check 56 that changes have not been made in a link. In this process, the length of a cable 10 is initially determined 58 using one or more of the methods described above, preferably both the delay and amplitude methods. In the single transceiver embodiment of FIG. 6, the transceiver 12 and a clock and/or attenuation detector 68 employ a reference test signal 72 to generate a reference elapsed time and/or attenuation measurement. In the double transceiver embodiment of FIG. 7, the transceiver A 12, the transceiver B 14, and the clock and/or attenuation detector 68 employ a reference test signal 72 and a reference response signal 74 to generate a reference elapsed time and/or attenuation measurement. The measured cable length (s) are then stored 60, or alternatively the measured delay time and/or attenuation may be stored. These stored value(s) may then be used as references or benchmarks for later checks of the cable integrity. At any point in time after these benchmark values are stored, the measurement process may again be invoked and new or subsequent "test" values may be obtained 62. In the single transceiver embodiment of FIG. 6, the transceiver 12 and the clock and/or attenuation detector 68 employ a subsequent test signal 76 to generate a subsequent elapsed time and/or attenuation measurement. In the double transceiver embodiment of FIG. 7, the transceiver A 12, the transceiver B 14, and the clock and/or attenuation detector 68 employ a subsequent test signal 76 and a subsequent response signal 78 to generate a subsequent elapsed time and/or attenuation measurement. A comparison 64 of any difference between the benchmark values and the test values, beyond a specified error tolerance may invoke a report and/or action 66, such as but not limited to, severing the network connection to the problem cable(s). In either of the embodiments of FIGS. 6 and 7, a change detector 70 responds to a difference between the reference elapsed time and/or attenuation measurement and the subsequent elapsed time and/or attenuation measurement. A change in the characteristics of the cable 10 might indicate an unauthorized connection or tap of the cable. For example, an unauthorized repeater added to the cable for the purpose of monitoring data would add some delay even if the repeater were carefully selected so that the amplitude of the signals in and out were identical. Preferably, this integrity check would be performed separately on each of the individual conductors in a given cable. In the claims, a device responsive to a difference between a reference elapsed time measurement and a subsequent elapsed time measurement in accordance with the foregoing is referred to as a "elapsed time change detector." In the claims, a device responsive to a difference between a reference amplitude attenuation measurement and a subsequent amplitude measurement in accordance with the foregoing is referred to as a "amplitude change detector." In the claims, a device responsive to a difference between a reference power attenuation measurement and a subsequent power measurement in accordance with the foregoing is referred to as a "power change detector."

These cable integrity checks may be performed at any time, including according to a schedule and/or randomly, or they may be triggered by a system level event. In one embodiment, the integrity checks may be performed when either a link failure occurs or the error rate for data transfers exceeds a specified limit. System level commands initiating an integrity check, sent to one or both of the transceivers 12 and/or 14 depending on the circumstances, would preferably be selected so that the commands would be difficult to distinguish from other data in the network. In this way, an unauthorized device would not easily be alerted to interfere with the integrity check, as might occur if a simple tone signal were used. In one embodiment, the integrity check may be disabled or reset by a system level command to allow situations such as continued system use after replacing a cable or knowingly tolerating a high error rate for data transfers.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What claimed is:

1. A method for verifying integrity of a cable link, said method comprising:

at a first transceiver, sending a reference test signal via said cable link to evoke a reference response signal that is returned via said cable link;

measuring a time delay between sending said reference test signal and receiving said reference response signal to obtain a benchmark indicator of length of said cable link; thereafter at said first transceiver, sending a subsequent test signal via said cable link to evoke a subsequent response signal that is returned via said cable link;

measuring a time delay between sending said subsequent test signal and receiving said subsequent test signal to obtain a subsequent indicator of length of said cable link;

comparing said benchmark indicator of length of said cable link and said subsequent indicator of length of said cable link to obtain a comparison between said benchmark indicator and said subsequent indicator; and determining integrity of said cable link based on said comparison.

2. The method of claim 1 further comprising:

at said first transceiver, prior to sending said reference test signal, sending a signal to a second transceiver on said cable link to indicate that a delay measurement is about to begin.

3. The method of claim 2 further comprising:

at said first transceiver, prior to sending said reference test signal, receiving an acknowledgement to said signal sent to indicate that a delay measurement is about to begin.

4. The method of claim 2 wherein said reference response signal and said subsequent response signal originate with a second transceiver on said cable link.

5. Apparatus for verifying integrity of a cable link, said apparatus comprising:

means for, at a first transceiver, sending a reference test signal via said cable link to evoke a reference response signal that is returned via said cable link;

means for measuring a time delay between sending said reference test signal and receiving said reference response signal to obtain a benchmark indicator of length of said cable link;

means for, at said first transceiver, sending a subsequent test signal via said cable link to evoke a subsequent response signal that is returned via said cable link;

means for measuring a time delay between sending said subsequent test signal and receiving said subsequent test signal to obtain a subsequent indicator of length of said cable link;

means for comparing said benchmark indicator of length of said cable link and said subsequent indicator of length of said cable link to obtain a comparison between said benchmark indicator and said subsequent indicator; and means for determining integrity of said cable link based on said comparison.

6. The apparatus of claim 5 further comprising:

means for, at said first transceiver, prior to sending said reference test signal, sending a signal to a second transceiver on said cable link to indicate that a delay measurement is about to begin.

7. The apparatus of claim 6 further comprising:

means for, at said first transceiver, prior to sending said reference test signal, receiving an acknowledgement to said signal sent to indicate that a delay measurement is about to begin.

8. The apparatus of claim 5 wherein said reference response signal and said subsequent response signal originate with a second transceiver on said cable link.

9. Apparatus for verifying integrity of a cable link, said apparatus comprising:

a first transceiver that sends test signal via said cable link to evoke a reference response signal that is returned via said cable link and thereafter sends a subsequent test signal via said cable link to evoke a subsequent response signal that is returned via said cable link;

a clock detector that measures a time delay between sending said reference test signal and receiving said reference response signal to obtain a benchmark indicator of length of said cable link and thereafter measures a time delay between sending said subsequent test signal and receives said subsequent test signal to obtain a subsequent indicator of length of said cable link; and a change detector that compares said benchmark indicator of length of said cable link and said subsequent indicator of length of said cable link to obtain a comparison between said benchmark indicator and said subsequent indicator and determines integrity of said cable link based on said comparison.

10. The apparatus of claim 9 wherein said first transceiver, prior to sending said reference test signal, sends a signal to a second transceiver on said cable link to indicate that a delay measurement is about to begin.

11. The apparatus of claim 10 wherein said first transceiver, prior to sending said reference test signal, receives an acknowledgement to said signal sent to indicate that a delay measurement is about to begin.

12. The apparatus of claim 9 wherein said reference response signal and said subsequent response signal originate with a second transceiver on said cable link.

* * * * *